United States Patent
Casci et al.

(10) Patent No.: US 12,233,725 B2
(45) Date of Patent: Feb. 25, 2025

(54) PREDICTIVE INDUCTOR COOLING

(71) Applicant: Ford Global Technologies, LLC, Dearborn, MI (US)

(72) Inventors: John P. Casci, Westland, MI (US); Moon Young Lee, Livonia, MI (US); Baoming Ge, Okemos, MI (US); Fan Wang, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 827 days.

(21) Appl. No.: 17/482,245

(22) Filed: Sep. 22, 2021

(65) Prior Publication Data
US 2023/0088076 A1    Mar. 23, 2023

(51) Int. Cl.
| | |
|---|---|
| *B60K 17/04* | (2006.01) |
| *B60L 50/90* | (2019.01) |
| *H01F 27/08* | (2006.01) |
| *H01F 27/10* | (2006.01) |
| *H05K 7/20* | (2006.01) |
| *B60K 6/20* | (2007.10) |
| *B60K 6/22* | (2007.10) |

(52) U.S. Cl.
CPC .............. *B60L 50/90* (2019.02); *B60K 17/04* (2013.01); *H01F 27/08* (2013.01); *H05K 7/20845* (2013.01); *B60K 6/20* (2013.01); *B60K 6/22* (2013.01); *H01F 27/10* (2013.01)

(58) Field of Classification Search
CPC .......... B60L 50/90; B60K 17/04; B60K 6/20; B60K 6/22; H01F 27/08; H01F 27/10; H05K 7/20845
See application file for complete search history.

(56) References Cited

U.S. PATENT DOCUMENTS

| | | | |
|---|---|---|---|
| 6,430,482 B1 | 8/2002 | Wakashiro et al. | |
| 7,795,844 B2 * | 9/2010 | Ichikawa et al. | ......... H02J 7/00 320/134 |
| 9,065,157 B2 | 6/2015 | Van Wiemeersch et al. | |
| 9,543,069 B2 * | 1/2017 | Vafakhah et al. | ...... H01F 27/12 |
| 9,581,234 B2 * | 2/2017 | Sung et al. | ......... F16H 57/0412 |
| 9,892,842 B2 * | 2/2018 | Vafakhah et al. | ...... H01F 27/06 |
| 2005/0029867 A1 | 2/2005 | Wood | |

FOREIGN PATENT DOCUMENTS

JP        4337848 B2    9/2009

* cited by examiner

*Primary Examiner* — John D Walters
(74) *Attorney, Agent, or Firm* — David B. Kelley; Brooks Kushman P.C.

(57) ABSTRACT

An automotive propulsion system has a transmission including an output shaft, a variable voltage converter including an inductor disposed within a housing of the transmission such that transmission fluid within the housing contacts the inductor to cool the inductor, and a controller that maintains a magnitude of current through the inductor to less than a limit value that is defined by a speed associated with the output shaft and a switching frequency of the variable voltage converter.

15 Claims, 5 Drawing Sheets

PREDICTIVE INDUCTOR COOLING

TECHNICAL FIELD

This disclosure relates to the control of automotive vehicle power electronic equipment.

BACKGROUND

Electric vehicles may use inductors to configure electricity within the power network. As inductors are exposed to current, they may increase in temperature. As such, a temperature threshold may be reached in which the inductor is losing power to heat rather than conversion. Some vehicles implement sensors in direct contact with the inductor to determine the temperature of the inductor.

SUMMARY

An automotive propulsion system includes a transmission including an output shaft, a variable voltage converter including an inductor disposed within a housing of the transmission such that transmission fluid within the housing contacts the inductor to cool the inductor, and a controller that maintains a magnitude of current through the inductor to less than a limit value that is defined by a speed associated with the output shaft and a switching frequency of the variable voltage converter.

A method includes maintaining a magnitude of current through an inductor, of a variable voltage converter disposed within a housing of a transmission such that transmission fluid within the housing contacts the inductor to cool the inductor, to less than a limit value that is defined by a switching frequency of the variable voltage converter and a speed associated with an output shaft of the transmission.

A vehicle includes a power network having a current source that provides energy to a vehicle drivetrain to accelerate the vehicle, an inductor electrically connected with the current source, and at least one sensor that senses at least one of a current value through the inductor, an input voltage value of the inductor, an output voltage value of the inductor, or a switching frequency value. The vehicle also includes a controller that, responsive to a temperature of the inductor, that is based on output of the at least one sensor, being less than a first predetermined temperature threshold, commands the current source to provide current to the inductor at a first electrical current value, and responsive to the temperature being greater than the first predetermined temperature threshold, commands the current source to provide current to the inductor at a second electrical current value.

DETAILED DESCRIPTION

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Certain variable voltage converters have inductors with corresponding thermal sensors to monitor inductor coil temperature. The associated control strategy will limit inductor power when the thermal sensor temperature reaches the designed limit.

Figure 1:
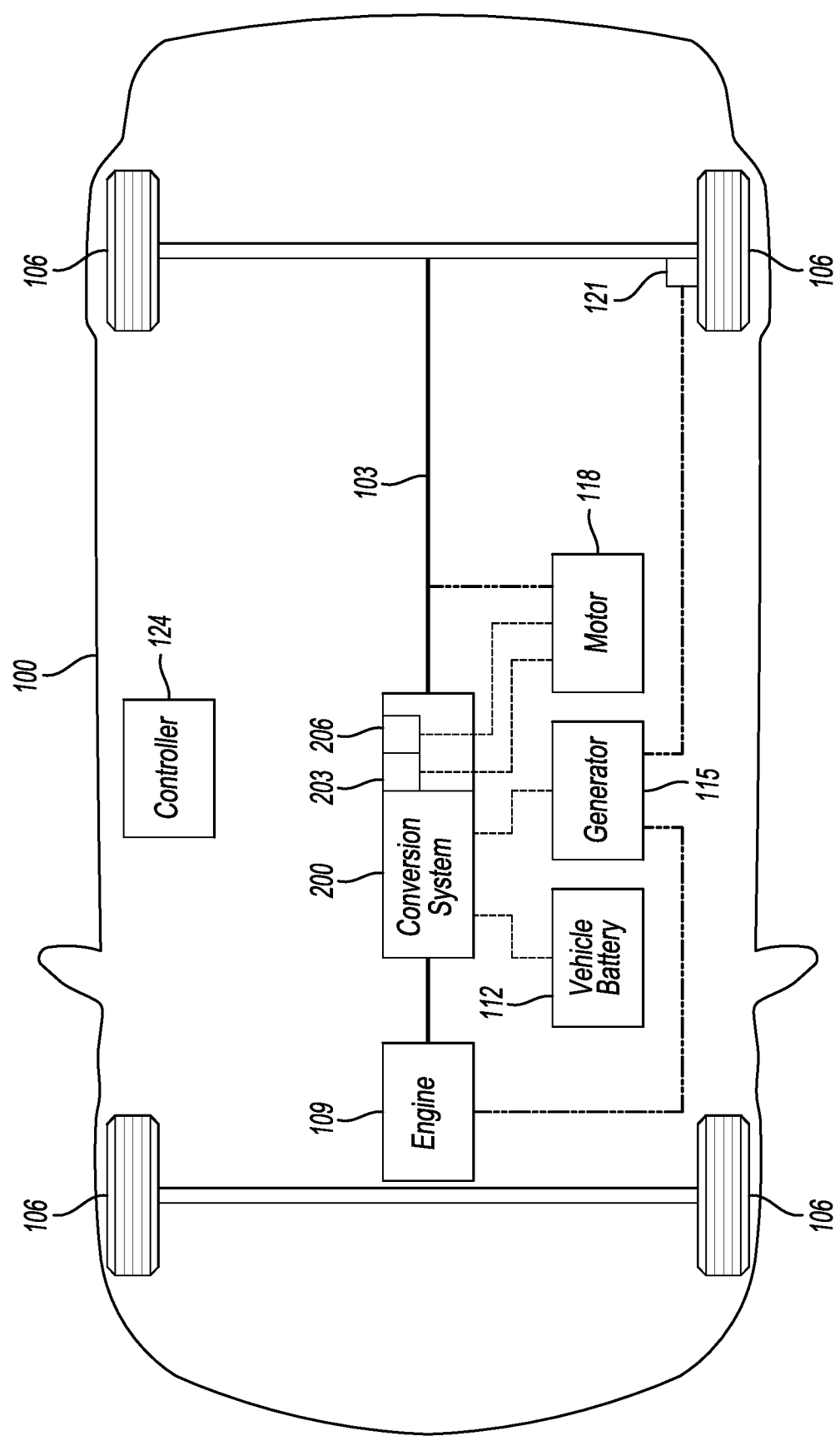
FIG. 1 is a block diagram of a vehicle.

FIG. 1 illustrates a block diagram of a vehicle 100. The vehicle 100 has a drivetrain 103. The drivetrain 103 may be configured to propel the vehicle 100. To propel the vehicle 100, the drivetrain 103 may configured to provide torque to a plurality of wheels 106. The drivetrain 103 may be in at least one of electrical, magnetic, or mechanical communication with at least one of an internal combustion engine, an electric power source, or a regenerative braking system. In some embodiments, the drivetrain 103 may be in fluid communication with the internal combustion engine.

The vehicle 100 may have a prime mover. Example of a prime mover include an internal combustion engine, a traction motor, etc. As depicted, the vehicle 100 contains both an engine 109 and a traction motor 118. In other embodiments, the vehicle 100 may only contain either an engine 109 or a traction motor 118. The traction motor 118 is mechanically linked to the drivetrain 103. The traction motor 118 is configured to provide torque to the plurality of wheels 106 via the drivetrain 103. To provide torque, the traction motor 118 may be configured to convert electrical energy into mechanical energy. For example, the traction motor 118 may be configured to receive electrical energy from a vehicle battery to provide mechanical energy to a vehicle drivetrain. Alternatively, the traction motor 118 may be configured to receive electrical energy from an electrical bus network. As such, the traction motor 118 may be configured to receive electrical energy from other vehicle components configured to provide electrical energy to the electrical bus network. The traction motor 118 may be configured to receive DC current.

The vehicle 100 is shown to have a vehicle battery 112. By way of further introduction, vehicle battery 112 may be used to provide power to the drivetrain 103 via the traction motor 118. The vehicle battery 112 may be a traction battery. The vehicle battery 112 may be used to store electrical energy. The vehicle battery 112 may include a plurality of battery cells. In some embodiments, at least two of the battery cells of the plurality of battery cells may be in series. Alternatively, or additionally, at least two of the battery cells of the plurality of battery cells may be in parallel. The vehicle battery may have a plurality of sensors. One of the sensors may determine and provide battery parameters to a vehicle controller.

In addition to the traction motor 118, the vehicle 100 may have other electrical machines. As depicted, the vehicle 100 contains a generator 115. The generator 115 may be configured to convert mechanical energy into electrical energy. In some embodiments, the generator 115 may be configured to convert mechanical energy from the engine 109 into electrical energy for charging the vehicle battery 112. The generator 115 may also be used to convert mechanical energy from the engine 109 into electrical energy for powering a vehicle load. The generator 115 may be configured to output DC electricity.

As depicted, the vehicle 100 has a regenerative braking system 121. The regenerative braking system 121 may be in mechanical communication with the plurality of wheels 106. The regenerative braking system 121 may be used to convert mechanical energy into electrical energy. For example, the regenerative braking system 121 may be used to convert inertia from braking into electrical energy by using in part, a magnet, to reduce the absolute velocity of a vehicle. Changing magnetic flux may produce an electrical current. The regenerative braking system 121 may be configured to provide the electrical current to an electrical component of the vehicle 100. For example, the regenerative braking system 121 may be in electrical communication with the vehicle battery 112, such that the regenerative braking system 121 is configured to produce electricity from inertia gathered from mechanical communication with the plurality of wheels 106.

The vehicle 100 contains a conversion system 200. The conversion system 200 is configured to convert energy for use with the drivetrain 103. In some embodiments, the conversion system 200 may modify electrical parameters of electricity provided to it. For example, the conversion system 200 may be configured to modify electricity have 480 volts into 5000 volts. The conversion system 200 may be bi-directional regarding direction of conversion. In some embodiments, the converter may be configured to vary its conversion. In such examples, the converter may be configured to change its conversion in response to a command from a controller. For example, the converter may be configured to convert 480 volts into 2400 volts in response to a first command from a controller, and further configured to convert 480 volts into 240 volts in response to a second command from the controller. In this embodiment, the conversion system 200 is in electrical communication with the vehicle battery 112, the generator 115, and the traction motor 118. The conversion system 200 may be configured to modify torque from the engine 109 before providing it to the plurality of wheels 106 via the drivetrain 103. The conversion system 200 may act as a cooling system. As such, the conversion system 200 may include vehicle coolant.

As shown, the conversion system 200 has a first inductor 203 and a second inductor 206. Both the first inductor 203 and second inductor 206 are configured to provide electrical current to the traction motor 118 from the vehicle battery 112. Further the first inductor 203 and second inductor 206 may be configured to facilitate electrical communication between an alternating current electrical bus network and a direct current electrical bus network. As such, the inductor may be used in devices other than the converter. Even further, an inductor may be a stand-alone device. The first inductor 203 and second inductor 206 may be configured to vary in allowable communication value. For example, one of the first inductor 203 and second inductor 206 may be configured to receive a signal for a controller to allow a first electrical current value to communicate, and further configured to receive a second signal from a controller to allow a second electrical current value to communicate, wherein the second electrical current value is less than the first electrical current value. The first inductor 203 and second inductor 206 may be configured to operate separately. For example, the first inductor 203 may be configured to allow a first electrical current value to communicate, and the second inductor 206 may be configured to allow a second electrical current value to communicate.

The conversion system 200 may act as an inductor cooling system. As such, the conversion system 200 may be in both fluid and thermal communication with the first inductor 203 and the second inductor 206. The conversion system 200 may be configured to reduce the temperature of one of the first inductor 203 and the second inductor 206. The conversion system 200 may be configured to introduce vehicle coolant to one of the first inductor 203 and the second inductor 206 to transfer heat from one of the first inductor 203 and the second inductor 206 to the coolant. In some embodiments, the conversion system 200 may be a transmission. In such embodiments, the conversion system 200 may cool one of the first inductor 203 and second inductor 206 via splash cooling.

The vehicle 100 has a controller 124. A controller 124 may include a memory system and a processor. The memory system may be configured to store instruction sets such as programs, algorithms, methods, etc. The memory system may be further configured to receive, monitor, and store values presented to the controller 124. Further, the memory may serve as a database. As such, the memory may create, store, and edit data stored in the database. The database may define a schedule. Alternatively, or additionally, the database may define a plurality of schedules. A schedule may include entries used as reference for operating a device. The processor may be configured to execute instruction sets. The controller 124 may be configured to receive signals indicative of information from external sources including but not limited to sensors, devices, and other controllers. The controller 124 may be configured to receive information by various ways including electrical communication and electrical-magnetic communication. Further, the vehicle may comprise a plurality of controllers.

The controller 124 may be a vehicle controller. As such, the controller 124 may be in communication with an engine, a vehicle battery, a drivetrain, an exhaust system, a generator, and a motor of a vehicle. The controller 124 may further be in commutation with braking systems, including a regenerative braking system and a friction braking system. The controller 124 may be configured to retrieve values from each of the components of a vehicle such as engine speed, transmission speed, vehicle coolant temperature, battery state of charge, vehicle torque, exhaust flow, and the conditions of a vehicle power network. The controller 124 may be configured to receive at least one signal from the plurality of sensors.

The vehicle 100 may comprise a plurality of sensors. The plurality of sensors may include a current sensor. The current sensor may be in electrical communication with and configured to determine the electrical current flowing through an inductor. The plurality of sensors may include a voltage sensor. The voltage sensor may be in electrical communication with and configured to determine the electrical potential of a vehicle battery. In some embodiments, the voltage sensor may be disposed on one of the electrical bus networks. As such the sensor may be configured to determine the potential difference between the electrical bus networks, and/or the vehicle ground. The sensor maybe configured to determine a boosted or bucked voltage. The plurality of sensors may include a signal switching sensor, configured to determine the switching frequency exposed to the inductor.

The controller 124 may comprise a temperature estimation algorithm. The temperature estimation algorithm may be configured to determine a temperature of the inductor. The estimation may comprise an inductor surface temperature value and an inductor temperature value. The temperature estimation algorithm may be configured to use vehicle metrics other than a thermal sensor to estimate the temperature of an inductor. For example, the temperature estimation algorithm may be configured to estimate the inductor temperature based at least on one of an electrical parameter of electricity flowing through the inductor and the amount of time the inductor was exposed to electricity. The temperature estimation algorithm may be configured to estimate a plurality of temperature values. In some embodiments, the temperature estimation algorithm may be configured to estimate an inductor surface temperature value and an inductor temperature value.

The controller 124 may comprise a power loss algorithm. The power loss algorithm may be configured to determine the amount of electrical power lost to one of heat and reactive conversion in a vehicle power network. The power loss algorithm may use at least one of the determinations from the plurality of sensors to estimate a power loss value from use of a corresponding inductor. For example, the power loss algorithm may use at least one of the inductor current, input battery voltage, output boosted voltage, switching frequency, and the inductor temperature to estimate a power loss from the inductor. The power loss value may be represented as a negative value.

The controller 124 may comprise a cooling capacity algorithm. The cooling capacity algorithm may be configured to determine the temperature value a vehicle cooling system is capable of cooling at the present state of the vehicle. To estimate the remaining cooling capacity, the cooling capacity algorithm may be configured to use at least one of the determinations form the plurality of sensors. For example, the cooling capacity algorithm may use at least one of vehicle engine speed, vehicle transmission speed, vehicle coolant temperature value, and inductor surface temperature value to determine the cooling capacity value. The cooling capacity value may be affected by various factors. In some embodiments, the cooling capacity may be affected by the cooling fluid temperature. In particular, the controller 124 may comprise a cooling fluid temperature schedule, wherein the cooling fluid temperature schedule is defined by datapoints of coolant fluid temperature and projected cooling values. The cooling capacity value may be represented as a positive value. Further, the controller 124 may be configured to produce a projected temperature value of an inductor. The projected temperature value may be based on the cooling capacity value as well as the temperature of the inductor.

The controller 124 may comprise an energy optimization algorithm. The energy optimization algorithm may be configured to regulate electrical current to the inductor. In the energy optimization algorithm, the controller may determine a maximum amount of electrical power permitted to flow to an inductor. The maximum amount of electrical power may be a limit value. The limit value may be defined, for example via a lookup table, etc., by at least one of a speed of an output shaft of a transmission and a switching frequency of a converter. As such, the limit value may increase with the speed of the output shaft. Additionally, or alternatively, the limit value may decrease as the switching frequency increases. The controller 124 thus operates to maintain a magnitude of current through the inductor to less than the limit value.

In some embodiments, the limit value may be an electrical current. If the controller has set a first limit value and a projected temperature of the inductor exceeds a predetermined threshold, the controller may derate the inductor. The controller derates the inductor by setting a second limit value lower than the first limit value.

In one embodiment, the energy optimization algorithm may compare one of the inductor surface temperature and the inductor temperature to a threshold temperature value. Upon exceeding the temperature value, the energy optimization algorithm may be configured to execute both the power loss algorithm and the cooling capacity algorithm. After completion of the power loss algorithm and the cooling capacity algorithm, the energy optimization algorithm may sum the power loss value and the cooling capacity value to produce an optimization value.

In some embodiments, if the optimization value is less than zero, the energy optimization algorithm may further determine the flow of the vehicle coolant system. The optimization algorithm may act to increase the flow rate of the vehicle coolant in response to a factor or event that will increase the temperature of the inductor. For example, the controller may be programmed to increase the flow rate of the vehicle coolant in response to the switching frequency of a variable voltage converter increasing. If the flow of the vehicle coolant is less than maximum for which the vehicle coolant system is capable, the energy optimization algorithm may command the vehicle coolant system to increase the flow. If the flow of the vehicle coolant is at maximum, the energy optimization algorithm may command the vehicle power network to derate the inductor. Derating the inductor may include reducing the electrical current exposed to the inductor, changing the switching frequency exposed to the inductor, and/or changing the potential differential exposed to the inductor. Additionally, or alternatively, derating may include redirecting electricity from the corresponding inductor to another inductor.

Figure 2A:
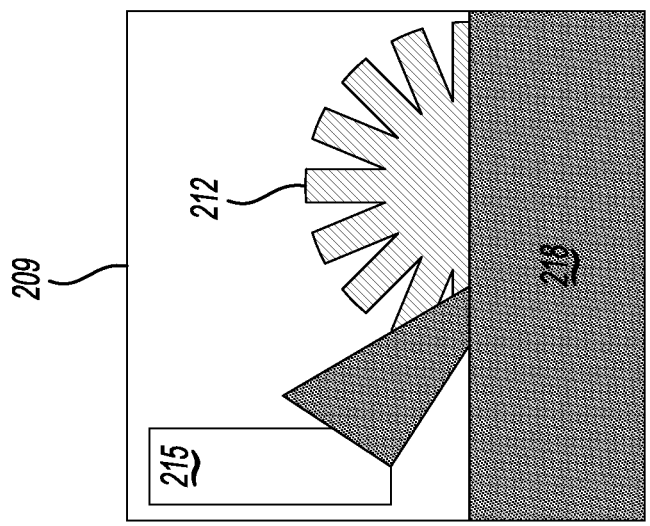
FIG. 2a illustrates a cooling dynamic at a first gear speed.
Figure 2B:
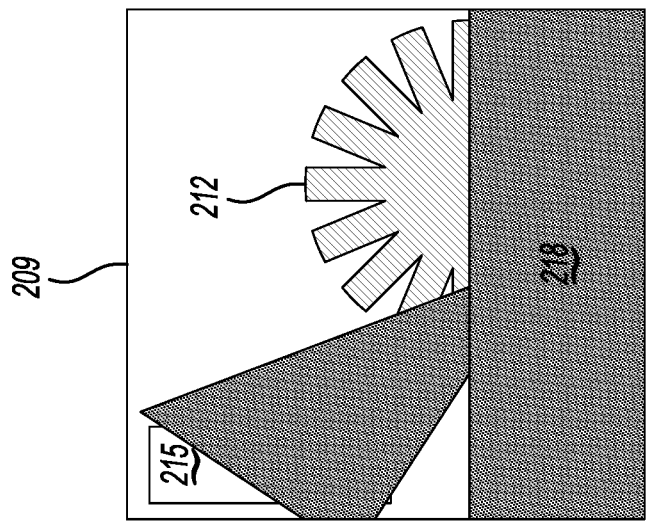
FIG. 2b illustrates a cooling dynamic at a second gear speed.
Figure 2C:
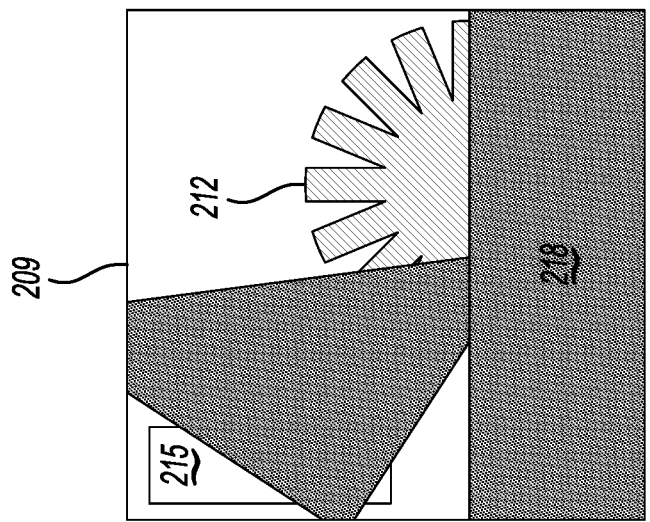
FIG. 2c illustrates a cooling dynamic at a third gear speed.

FIGS. 2a-2c depict various stages of splash cooling. Splash cooling may cool an inductor by introducing coolant to the inductor by way of a rotating gear. A conversion system 200 using splash cooling may be a transmission. In such embodiments, the conversion system 200 may have a transmission housing 209, a transmission gear 212, an inductor 215 and a vehicle coolant 218. The transmission housing 209 may act to partially contain the vehicle coolant 218. The transmission gear 212 may be configured to rotate. The transmission gear 212 may be disposed such that at least a portion of the transmission gear 212 is submerged in vehicle coolant 218. In such an embodiment, the transmission gear 212 may act to splash the inductor 215 with the vehicle coolant 218. The inductor 215 may be positioned such that higher splashing of the vehicle coolant 218 increases thermal transfer between the inductor 215 and the vehicle coolant 218. As rotational speed of the transmission gear 212 increases, the amount of vehicle coolant 218 exposed to the inductor 215 may increase.

FIG. 2a illustrates a cooling dynamic at a first gear speed. At the first gear speed, the transmission gear 212 acts to partially submerge the inductor 215 with the vehicle coolant 218.

FIG. 2b illustrates a cooling dynamic at a second gear speed. The second gear speed is higher than the first gear speed. Here, the inductor 215 is generally fully submerged with the vehicle coolant 218. Further, the transmission gear 212 splashes a minimal section of the transmission housing 209 with coolant. As such, increasing speed from the first gear speed to the second gear speed increases efficiency in cooling the inductor 215.

FIG. 2c illustrates a cooling dynamic at a third gear speed. The third gear speed is higher than the first and second gear speed. Here, the inductor 215 is generally fully submerged with the vehicle coolant 218. However, unlike with the second gear speed, the transmission gear 212 acts to splash a substantial amount of vehicle coolant 218 on the transmission housing 209. As such, increasing speed above the second gear speed does not increase efficiency in cooling the inductor 215.

Figure 3:
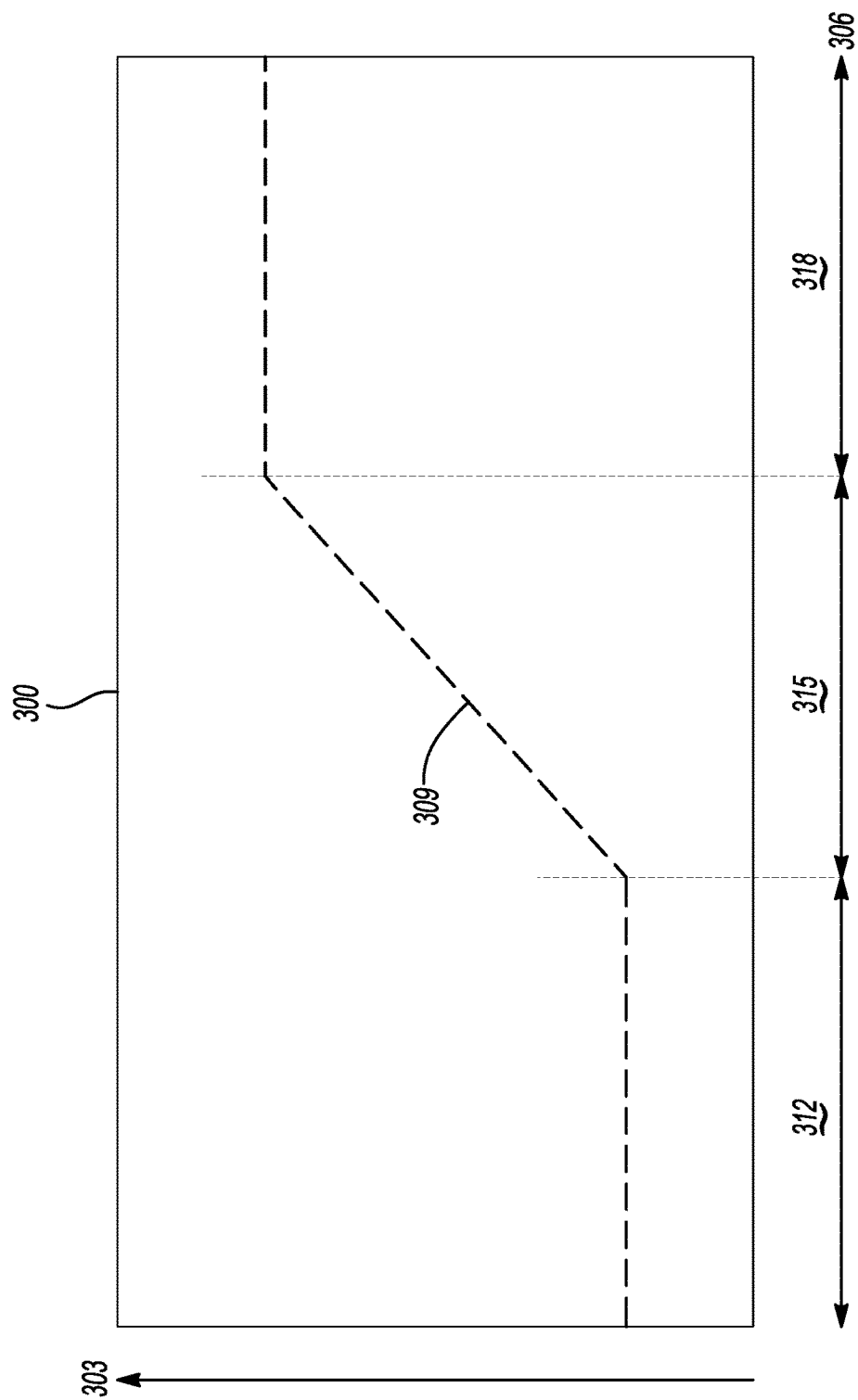
FIG. 3 illustrates an expected cooling capacity schedule.

FIG. 3 illustrates an expected cooling capacity schedule 300. As discussed regarding FIGS. 2a-2c, the speed of various gear speeds may affect the cooling capacity of the conversion system 200. The expected cooling capacity schedule 300 has a cooling capacity axis 303 and a gear speed axis 306. The expected cooling capacity schedule 300 defines a cooling capacity plot 309. The cooling capacity axis 303 is indicative of cooling capacity values. The gear speed axis 306 is indicative of gear speed values. The gear speed axis 306 is defined by a first cooling capacity range 312, a second cooling capacity range 315, and a third cooling capacity range 318. Values from the expected cooling capacity schedule 300 within the first cooling capacity range 312 may not change with vehicle speed. The first cooling capacity range 312 may correspond with vehicle speeds in which the splashing of the vehicle coolant 218 from the transmission gear 212 does not reach the inductor 215. As such, the inductor 215 is not cooled by the vehicle coolant 218. Values from the expected cooling capacity schedule 300 with the second cooling capacity range 315 may rise with the gear speed within the second cooling capacity range 315. The second cooling capacity range 315 may correspond with vehicle speeds in which splashing of vehicle coolant 218 from the transmission gear 212 are initiated upon the inductor 215. As the speed increases, more vehicle coolant 218 is exposed to the inductor 215. Values from the expected cooling capacity schedule 300 within the third cooling capacity range 318 may not change with vehicle speed. The third cooling capacity range 318 may correspond with vehicle speeds in which the inductor 215 is submerged within the vehicle coolant 218.

Figure 4:
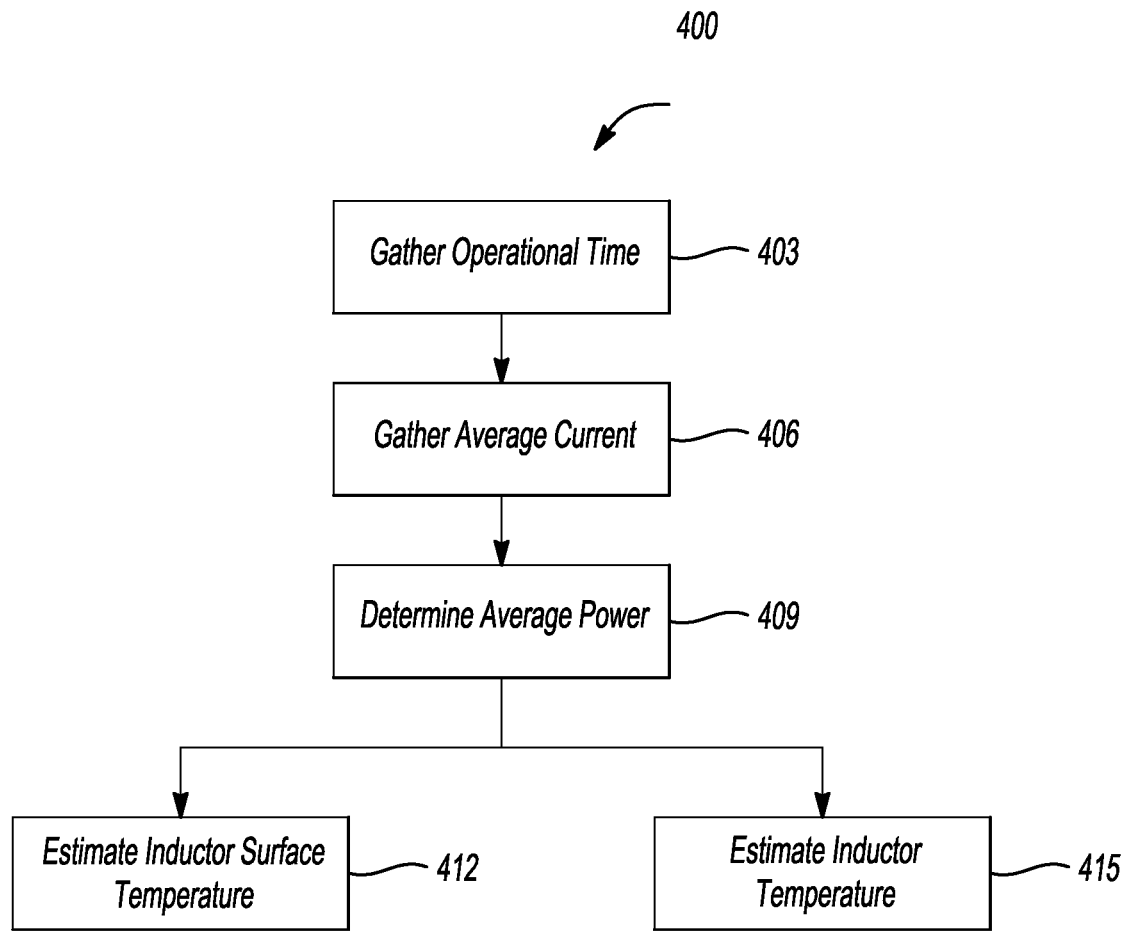
FIG. 4 is a flow chart of a temperature estimation algorithm.

FIG. 4 depicts the temperature estimation algorithm 400. The temperature estimation algorithm 400 begins with a total time step 403 in which the temperature estimation algorithm 400 gathers the total time an inductor has been in operation. Next, the temperature estimation algorithm 400 moves to the average current step 406, in which the temperature estimation algorithm 400 gathers the average current the inductor has been exposed to during its operation. In alternative embodiments, the temperature estimation algorithm 400 may gather an alternative power exposure value. The temperature estimation algorithm 400 then moves to a total average power step 409, in which the temperature estimation algorithm 400 determines an average power the inductor has been exposed to. Lastly, the temperature estimation algorithm 400 estimates the temperature of the inductor. In this embodiment, the temperature estimation algorithm 400 determines an inductor surface temperature of the inductor in an inductor surface temperature step 412, and an inductor temperature of the inductor in an inductor temperature step 415.

Figure 5:
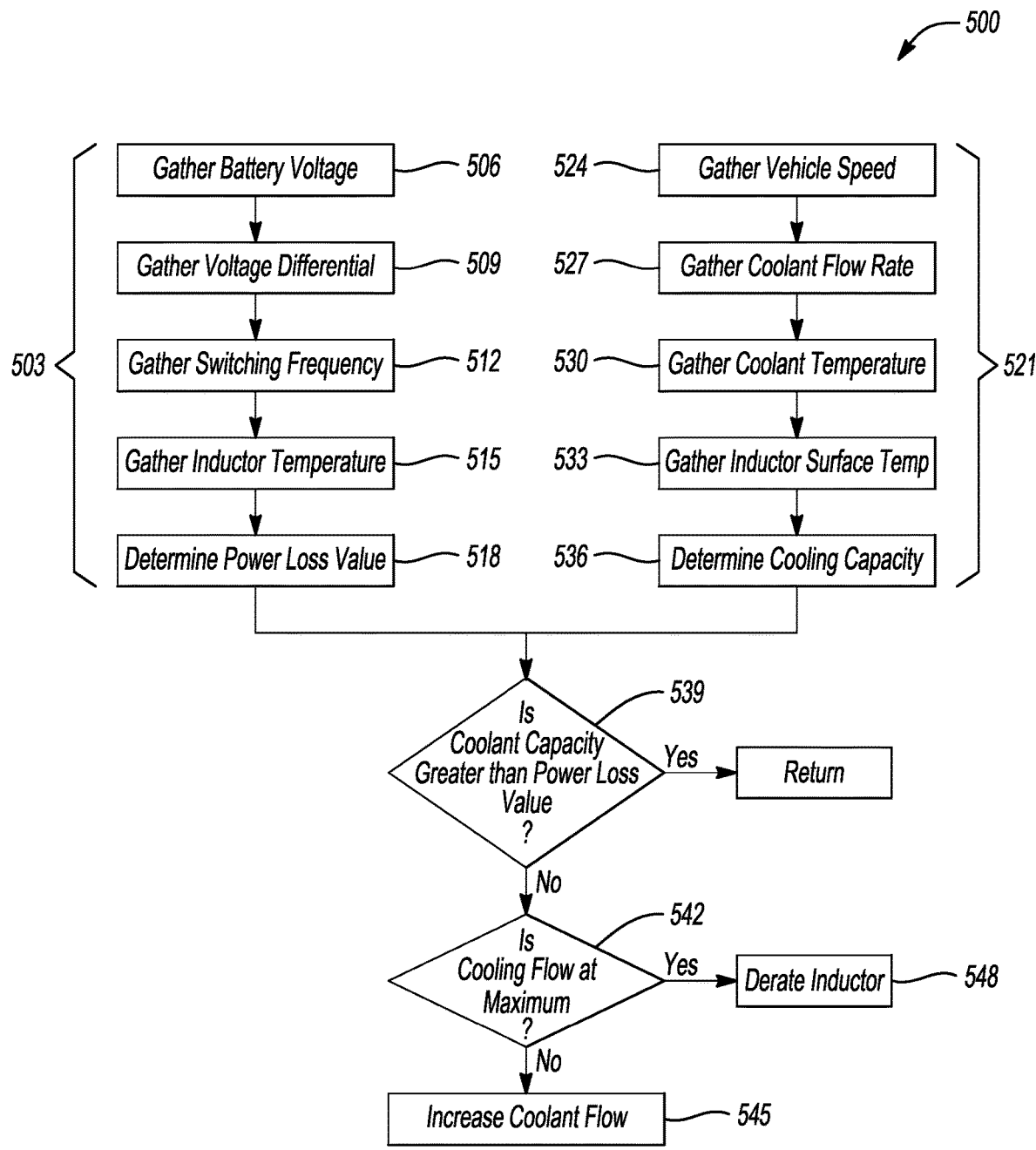
FIG. 5 is a flow chart of an energy optimization algorithm.

FIG. 5 depicts the energy optimization algorithm 500. The energy optimization algorithm 500 includes a power loss subroutine 503 and a cooling capacity subroutine 521. The power loss subroutine 503 begins with a battery voltage step 506, in which the energy optimization algorithm step 500 gathers the voltage of the primary battery. Next, the power loss subroutine 503 moves to a voltage differential step 509, in which the energy optimization algorithm 500 retrieves the difference between the high and low electrical bus networks. The power loss subroutine 503 then moves on to a switching frequency step 512, in which the energy optimization algorithm 500 determines the switching frequency exposed to the inductor. The power loss subroutine 503 further progresses to an inductor temperature step 515, in which the power loss subroutine 503 gathers the estimation from the inductor temperature step 415, indicative of the inductor estimation. Lastly, the power loss subroutine 503 determines a power loss value in a power loss value step 518. The cooling capacity subroutine 521 begins with a vehicle speed value step 524, in which the energy optimization algorithm 500 retrieves the speed of the vehicle. The speed of the vehicle may determine the flow of air thorough the vehicle cooling system. The cooling capacity subroutine 521 then moves to a coolant flow rate step 527, in which the energy optimization algorithm 500 gathers the present flow rate value of coolant throughout the vehicle cooling system. Moving on, the cooling capacity subroutine 521 executes a coolant temperature step 530, in which the temperature of the vehicle coolant is retrieved. Further, the cooling capacity subroutine 521 retrieves the estimated inductor surface temperature produced in the inductor surface temperature step 412 in an inductor surface temperature step 533. Lastly, the cooling capacity subroutine 521 determines the remaining cooling capacity in the vehicle cooling system in the cooling capacity step 536. After the power loss value step 518 and cooling capacity step 536 are complete, the energy optimization algorithm 500 will move to a compare capacity step 539 and sum the power loss value and the cooling capacity value. If the sum is less than zero, the energy optimization algorithm 500 will return to the beginning of the algorithm. If the sum is greater than zero, the energy optimization algorithm 500 will determine the capacity of the current coolant flow in a flow max step 542. If the coolant flow is less than a predetermined flow value, the energy optimization algorithm 500 will move to an increase coolant rate step 545 and increase the flow. However, if the coolant flow is at or above the predetermined flow value, the energy optimization algorithm 500 will move to a derate inductor step 548, in which the inductor is derated (the limit value is decreased responsive to the coolant flow exceeding the predetermined flow value). The predetermined flow value may be the maximum the vehicle cooling system can provide. The coolant flow may also increase as the switching frequency of a variable voltage converter increases.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. An automotive propulsion system comprising:
a transmission including an output shaft;
a variable voltage converter including an inductor disposed within a housing of the transmission such that transmission fluid within the housing contacts the inductor to cool the inductor; and
a controller programmed to maintain a magnitude of current through the inductor to less than a limit value that is defined by a speed associated with the output shaft and a switching frequency of the variable voltage converter.

2. The automotive propulsion system of claim 1, wherein the controller is further programmed to increase the limit value as the speed associated with the output shaft increases.

3. The automotive propulsion system of claim 1, wherein the controller is further programmed to decrease the limit value as the switching frequency of the variable voltage converter increases.

4. The automotive propulsion system of claim 1, wherein the controller is further programmed to decrease the limit value responsive to a flow rate of the transmission fluid exceeding a predetermined flow value.

5. The automotive propulsion system of claim 4, wherein the controller is further programmed to increase the flow rate as the switching frequency of the variable voltage converter increases.

6. A method comprising:
maintaining a magnitude of current through an inductor, of a variable voltage converter disposed within a housing of a transmission such that transmission fluid within the housing contacts the inductor to cool the inductor, to less than a limit value that is defined by a switching frequency of the variable voltage converter and a speed associated with an output shaft of the transmission.

7. The method of claim 6 further comprising increasing the limit value as the speed associated with the output shaft increases.

8. The method of claim 6 further comprising decreasing the limit value as the switching frequency of the variable voltage converter increases.

9. The method of claim 6 further comprising decreasing the limit value responsive to a flow rate of the transmission fluid exceeding a predetermined flow value.

10. The method of claim 9 further comprising increasing the flow rate as the switching frequency of the variable voltage converter increases.

11. A vehicle comprising:
a power network having a current source configured to provide energy to a vehicle drivetrain to accelerate the vehicle;
an inductor electrically connected with the current source;
at least one sensor configured to sense at least one of a current value through the inductor, an input voltage value of the inductor, an output voltage value of the inductor, or a switching frequency value; and
a controller programmed to,
responsive to a temperature of the inductor, that is based on output of the at least one sensor, being less than a first predetermined temperature threshold, command the current source to provide current to the inductor at a first electrical current value, and
responsive to the temperature being greater than the first predetermined temperature threshold, command the current source to provide current to the inductor at a second electrical current value.

12. The vehicle of claim 11 further comprising an inductor cooling system in thermal communication with the inductor and having at least one thermal sensor configured to sense a cooling fluid temperature or a vehicle speed, wherein the controller is further programmed to estimate a cooling capacity of the inductor cooling system.

13. The vehicle of claim 12, wherein the controller is further programmed to determine a projected temperature value from the temperature and the cooling capacity.

14. The vehicle of claim 13 further comprising another inductor electrically connected with the current source, wherein the controller is further programmed to, responsive to the temperature or the projected temperature being greater than the first predetermined threshold, command the current source to provide current to the another inductor at a third electrical current value.

15. The vehicle of claim 14, wherein the controller is further programmed to determine an estimated temperature of the inductor based on output of the at least one sensor, and responsive to the estimated temperature being greater than the first predetermined temperature threshold, command the current source to provide to the another inductor current at a fourth electrical current value.

* * * * *